(12) United States Patent  
Morse

(10) Patent No.: US 9,198,274 B2  
(45) Date of Patent: Nov. 24, 2015

(54) ION CONTROL FOR A PLASMA SOURCE

(71) Applicant: Sputtering Components, Inc., Owatonna, MN (US)

(72) Inventor: Patrick Lawrence Morse, Tuscon, AZ (US)

(73) Assignee: Sputtering Components, Inc., Owatonna, MN (US)

( * ) Notice: Subject to any disclaimer, the term of this patent is extended or adjusted under 35 U.S.C. 154(b) by 0 days.

(21) Appl. No.: 13/932,632

(22) Filed: Jul. 1, 2013

(65) Prior Publication Data

US 2014/0007813 A1 Jan. 9, 2014

Related U.S. Application Data

(60) Provisional application No. 61/668,075, filed on Jul. 5, 2012.

(51) Int. Cl.
| | |
|---|---|
| H05H 1/24 | (2006.01) |
| C23C 16/48 | (2006.01) |
| H01J 37/32 | (2006.01) |
| C23C 16/515 | (2006.01) |
| H05H 1/46 | (2006.01) |

(52) U.S. Cl.
CPC ............... *H05H 1/24* (2013.01); *C23C 16/486* (2013.01); *C23C 16/515* (2013.01); *H01J 37/32027* (2013.01); *H01J 37/32146* (2013.01); *H05H 2001/4682* (2013.01)

(58) Field of Classification Search
None
See application file for complete search history.

(56) References Cited

U.S. PATENT DOCUMENTS

| 4,825,806 A | * | 5/1989 | Tawada et al. ................ 118/719 |
| 2003/0007910 A1 | * | 1/2003 | Diamant Lazarovich et al. ........................ 422/186.18 |
| 2005/0098430 A1 | * | 5/2005 | Tuymer et al. ........... 204/298.08 |
| 2006/0037700 A1 | * | 2/2006 | Shi et al. ................... 156/345.43 |
| 2006/0037701 A1 | * | 2/2006 | Koshiishi et al. ......... 156/345.44 |

FOREIGN PATENT DOCUMENTS

DE   19928053   1/2001

* cited by examiner

*Primary Examiner* — Joseph Miller, Jr.
(74) *Attorney, Agent, or Firm* — Fogg & Powers LLC

(57) ABSTRACT

One embodiment is directed to a plasma source comprising a cavity and at least first and second electrodes. The plasma source is configured to, during a first portion of each cycle, bias the first electrode as a cathode and use the second electrode as an anode, during a second portion of each cycle, apply an ion flush bias to the first and second electrodes, during a third portion of each cycle, bias the second electrode as a cathode and use the first electrode as an anode, and during a fourth portion of each cycle, apply an ion flush bias to the first and second electrodes. Other embodiments are disclosed.

14 Claims, 5 Drawing Sheets

ION CONTROL FOR A PLASMA SOURCE

CROSS-REFERENCE TO RELATED APPLICATION

This application claims the benefit of U.S. Provisional Patent Application Ser. No. 61/668,075, filed on Jul. 5, 2012, which is hereby incorporated herein by reference.

BACKGROUND

Plasma-enhanced chemical vapor deposition (PECVD) is a process used to deposit thin films on a substrate. A plasma source is used to generate plasma that can be used to activate a precursor material on or near the substrate. PECVD systems are well suited for the deposition of metal oxides as a majority of the precursors used readily react with oxygen.

German Patent DE19928053 describes a 50 kHz plasma source that uses of a pair of electrodes that are configured to operate as a cold cathode with the electrodes being biased as alternating cathodes and anodes. Such a plasma source can make use of an alternating current (AC) or bipolar pulse DC power supplies. However, in some applications (especially applications where a high energy ion beam is needed) the electrode switching provided in such a plasma source might not create an ion flux with sufficient energy levels for the application.

SUMMARY

One embodiment is directed to a plasma source comprising at least first and second electrodes. The plasma source is configured to, during a first portion of each cycle, bias the first electrode as a cathode and use the second electrode as an anode, during a second portion of each cycle, apply an ion flush bias to the first and second electrodes, during a third portion of each cycle, bias the second electrode as a cathode and use the first electrode as an anode, and during a fourth portion of each cycle, apply an ion flush bias to the first and second electrodes.

Another embodiment is directed to a method of controlling a plasma source comprising at least first and second electrodes. The method comprises, during a first portion of each cycle, biasing the first electrode as a cathode and using the second electrode as an anode, during a second portion of each cycle, applying an ion flush bias to the first and second electrodes, during a third portion of each cycle, biasing the second electrode as a cathode and using the first electrode as an anode, and during a fourth portion of each cycle, applying an ion flush bias to the first and second electrodes.

Another embodiment is directed to a deposition system that comprises a substrate and a plasma source configured to discharge an ion beam onto the substrate. The plasma source comprises at least first and second electrodes. The plasma source is configured to, during a first portion of each cycle, bias the first electrode as a cathode and use the second electrode as an anode, during a second portion of each cycle, apply an ion flush bias to the first and second electrodes, during a third portion of each cycle, bias the second electrode as a cathode and use the first electrode as an anode, and during a fourth portion of each cycle, apply an ion flush bias to the first and second electrodes.

DRAWINGS

DETAILED DESCRIPTION

Figure 1A:
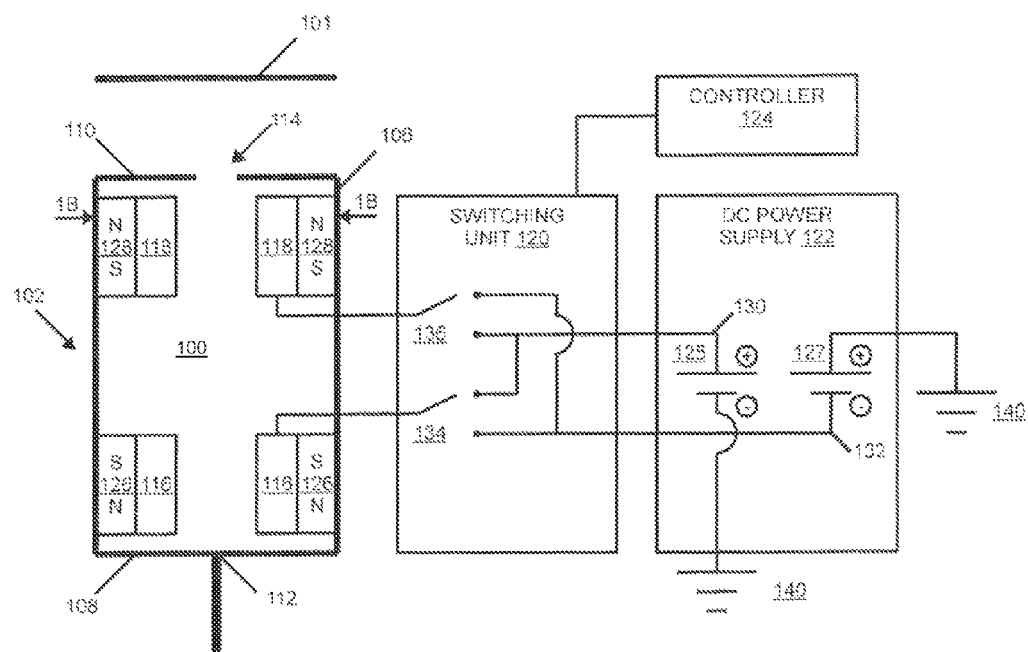
FIG. 1A is a block diagram of an exemplary embodiment of a plasma source in which the ion control techniques described here can be employed.
Figure 1B:
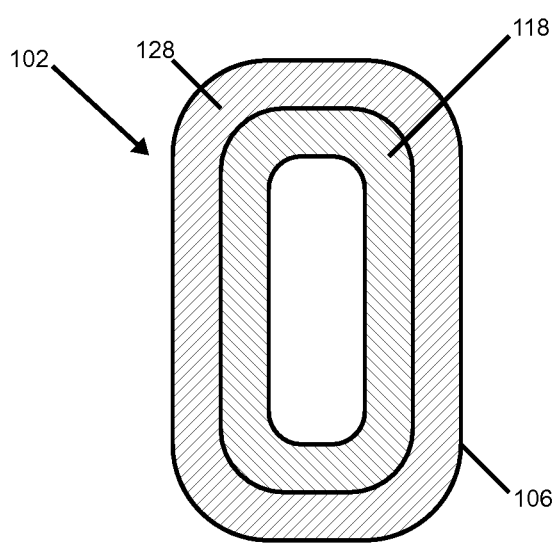
FIG. 1B is a cross section of the exemplary plasma source of FIG. 1 taken along line 1B-1B.

FIG. 1 is a block diagram of an exemplary embodiment of a plasma source 100 in which the ion control techniques described here can be employed. FIG. 1B is a cross section of the plasma source 100 taken along the line 1B-1B. Collectively, FIGS. 1A and 1B are referred to below as "FIG. 1". The plasma source 100 is suitable for use, for example, in PECVD sputtering systems.

The plasma source 100 comprises a cavity 102 in which ions and electrons are formed. The cavity 102 is formed by or in a housing or other suitable structure. In the particular embodiment shown in FIG. 1, the cavity 102 comprises a racetrack shaped wall 106 and first and second end walls 108 and 110. The racetrack nature of the cavity 102 and the wall 106 are shown in FIG. 1B. In the particular embodiment shown in FIG. 1, the cavity 102 includes one or more inlets 112 located near the first end wall 108 via which process gases are supplied to the cavity 102 and/or a vacuum can be maintained. A discharge aperture 114 is formed in the second end wall 110 through which ions and electrons formed in the cavity 102 are discharged onto a substrate 101.

At least two electrodes 116 and 118 are housed within the cavity 102 of the plasma source 100. In the particular embodiment shown in FIG. 1, the electrodes 116 and 118 have a racetrack shape and are formed along the inside of the wall 106 of the cavity 102. The racetrack shape of the second electrode 118 is shown in FIG. 1B.

The two electrodes 116 and 118 are connected to a switching unit 120 that in turn is coupled to a direct current (DC) power supply 122. A controller 124 controls the operation of the switching unit 120 and the DC power supply 122 in order to bias the electrodes 116 and 118 as described in more detail below. The controller 124 can be implemented in any conventional manner (for example, using a suitably programmed micro-controller or other programmable processor).

In some implementations of this embodiment, the walls 106, 108, and 110 can also be biased as an (fixed) anode.

In the particular embodiment shown in FIG. 1, magnets 126 and 128 are also housed within the cavity 102 in order to control the electron path within the cavity 102. In this example, magnets 126 and 128 have a racetrack shape and are formed along the inside of the wall 106 of the cavity 102. The racetrack shape of the magnet 128 is shown in FIG. 1B. In this example, the poles of the magnets 126 and 128 are arranged in an complimentary fashion with the north pole (N) of the first magnet 126 near the first end wall 108, the south pole (S) of the first magnet 126 near the second magnet 128, the south pole (S) of the second magnet 128 near the first magnet 126, and the north pole (N) of the second magnet 128 near the second wall 110. Magnets 126 and 128 can be permanent magnets or electro-magnetics and are arranged so as to provide a uniform magnetic field.

In the embodiment shown in FIG. 1, the direct current power supply 124 comprises two DC power supplies 125 and 127. A first DC power supply 125 is used to supply a positive voltage that is used to bias each of the electrodes 116 and 118 as a cathode and that is used to supply a positive ion flush bias.

A second DC power supply 127 is used to supply a negative voltage. Each of the electrodes 116 and 118 is coupled to the second DC power supply 127, as described below, in order for the electrode 116 or 118 to be used as an anode. Also, the second DC power supply 127 is used to apply a negative ion flush bias to each of the electrodes 116 and 118.

For each pulse, the first DC power supply 125 is used to output a positive pulse (for example, 500 Volts) at its positive output 130. The negative terminal of the first DC power supply 125 is coupled to ground 140. For each pulse, the second DC power supply 127 is used to output a negative pulse (for example, −350 Volts) at its negative output 132. The positive terminal of the second DC power supply 127 is coupled to ground 140.

The switching unit 120 comprises a first switch 134 that is configured to couple the first electrode 116 to either the positive output 130 of the first DC power supply 125 or the negative output 132 of the second DC power supply 127 under the control of the controller 124. The switching unit 120 further comprises a second switch 136 that is configured to couple the second electrode 118 to either the positive output 130 of the first DC power supply 125 or the negative output 132 of the second DC power supply 127 under the control of the controller 124.

The controller 124 is configured so that, while each pulse is being output by the first and second DC power supplies 125 and 127, the switches 134 and 136 can be adjusted so that either the positive voltage output by the first DC power supply 125 or the negative voltage output by the second DC power supply 127 is applied to each of the electrodes 116 and 118.

The switching unit 120 (and the switches described herein) and the controller 124 can be implemented using a suitably configured conventional bi-polar pulse power supply controller.

The switching unit 120, direct current power supply 122, and controller 124 (and the general approach of method 200 described below) can be used to control the amount of ion flux that is created using the plasma source 100.

Figure 2:
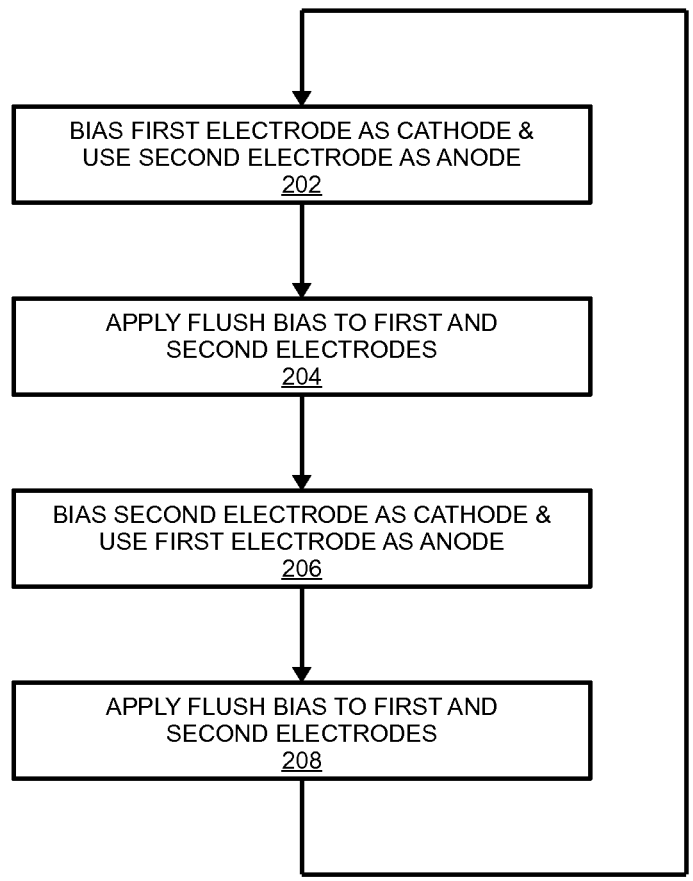
FIG. 2 is a flow diagram of an exemplary embodiment of a method of controlling a plasma source.

FIG. 2 is a flow diagram of an exemplary embodiment of a method 200 of controlling a plasma source. The embodiment of method 200 shown in FIG. 2 is described here as being implemented using the plasma source 100 shown in FIG. 1, though it is to be understood that other embodiments can be implemented in other ways. As noted above, method 200 can be used to control the ion flux toward the substrate 101 that is created using the plasma source 100.

Method 200 is performed once for each complete cycle (also referred to here as a "pulse cycle".

Method 200 comprises, during a first pulse in each pulse cycle, biasing the first electrode 116 as a cathode and using the second electrode 118 as an anode (block 202 of FIG. 2), and, during a second pulse in each pulse cycle, applying an ion flush bias to the two electrodes 116 and 118 (block 204 of FIG. 2).

Method 200 further comprises, during a third pulse in each pulse cycle, biasing the second electrode 118 as a cathode and using the first electrode 116 as an anode (block 206 of FIG. 2), and, during a fourth pulse in each pulse cycle, applying an ion flush bias to the two electrodes 116 and 118 (block 208 of FIG. 2).

Figure 3:
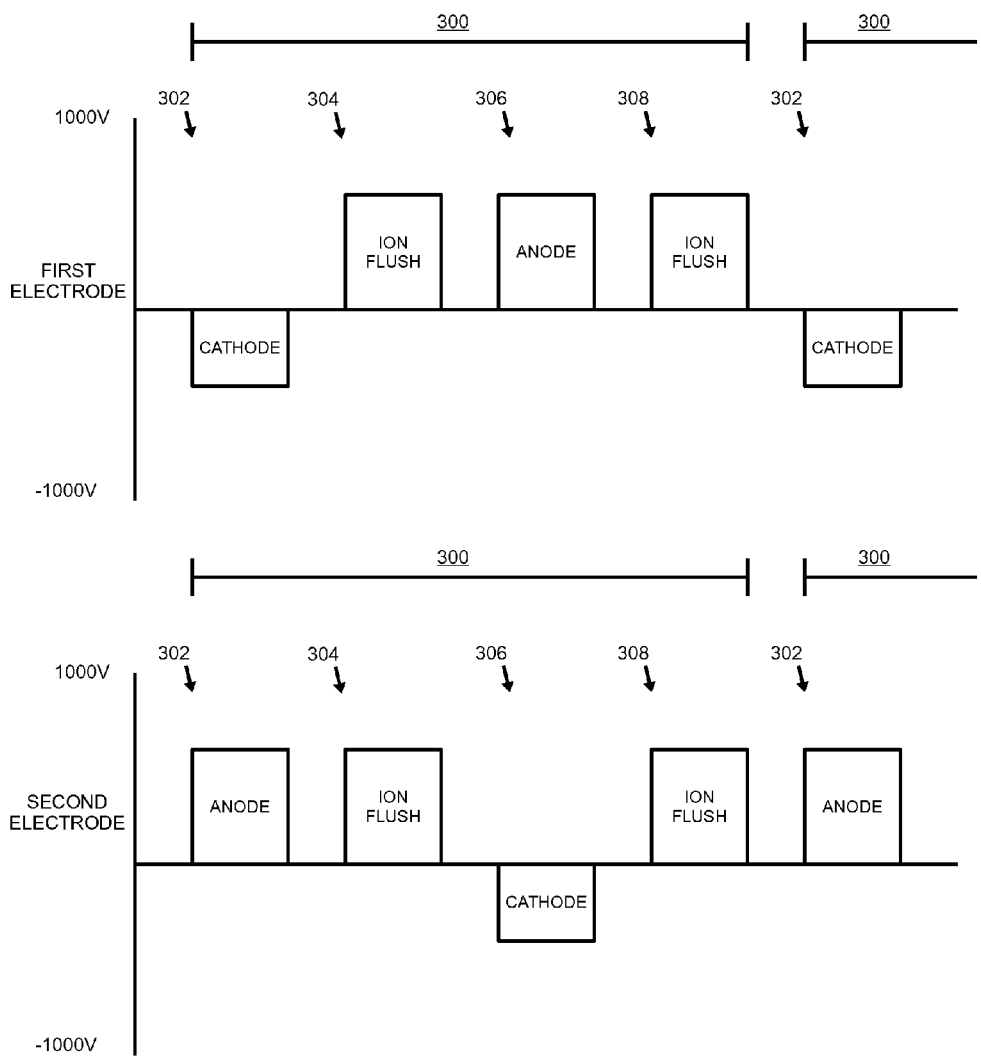
FIG. 3 illustrates the operation of the exemplary method shown in FIG. 2 using a positive ion flush bias.

The plasma source 100 and method 200 can be used to increase the ion flux toward the substrate 101 that is created using the plasma source 100 by using the positive voltage output by the first DC power supply 125 as a positive ion flush bias during the second and fourth pulses of each pulse cycle. This is illustrated in FIG. 3.

During the first pulse 302 of each pulse cycle 300, the first electrode 116 is biased as a cathode by using the first switch 134 to couple the first electrode 116 to the negative output 132 of the second DC power supply 127 and the second electrode 118 is used as an anode by using the second switch 136 to couple the second electrode 118 to the positive output 130 of the first DC power supply 125.

During the second pulse 304 of each pulse cycle 300, a positive ion flush bias is applied to the two electrodes 116 and 118 of the plasma source 100 by using the first and second switches 134 and 136 to couple the electrodes 116 and 118 to the positive output 130 of the first DC power supply 125.

During the third pulse 306 in each pulse cycle 300, the second electrode 118 is biased as a cathode by using the second switch 136 to couple the second electrode 118 to the negative output 132 of the second DC power supply 127 and the first electrode 116 is used an anode by using the first switch 134 to couple the first electrode 116 to the positive output 130 of the first DC power supply 125.

During the fourth pulse 308 in each pulse cycle 300, a positive ion flush bias is applied to the two electrodes 116 and 118 of the plasma source 100 by using the first and second switches 134 and 136 to couple the electrodes 116 and 118 to the positive output 130 of the first DC power supply 125.

Figure 4:
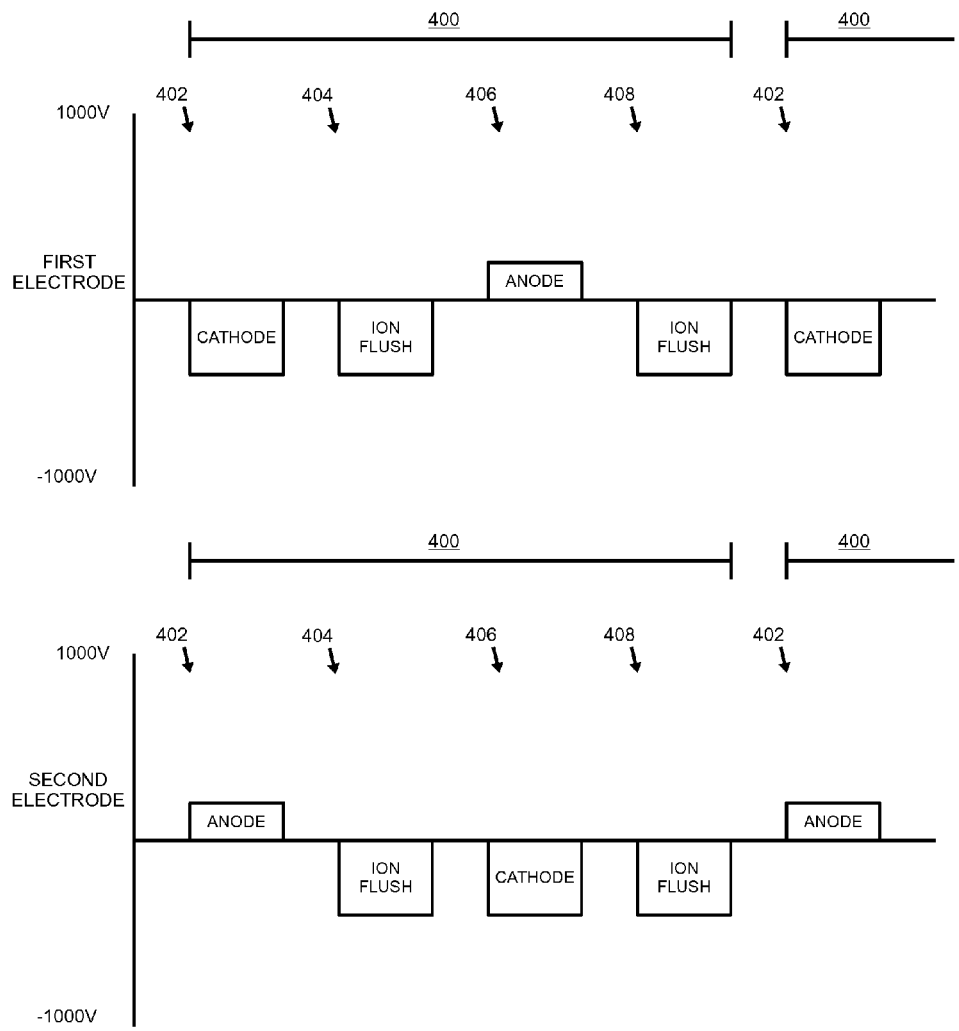
FIG. 4 illustrates the operation of the exemplary method shown in FIG. 2 using a negative ion flush bias.

The plasma source 100 and method 200 can also be used to decrease the ion flux toward the substrate 101 that is created using the plasma source 100 by using the negative voltage output by the second DC power supply 127 as a negative ion flush bias during the second and fourth pulses of each pulse cycle. This is illustrated in FIG. 4.

During the first pulse 402 of each pulse cycle 400, the first electrode 116 is biased as a cathode by using the first switch 134 to couple the first electrode 116 to the negative output 132 of the second DC power supply 127 and the second electrode 118 is used as an anode by using the second switch 136 to couple the second electrode 118 to the positive output 130 of the first DC power supply 125.

During the second pulse 404 of each pulse cycle 400, a negative ion flush bias is applied to the two electrodes 116 and 118 of the plasma source 100 by using the first and second switches 134 and 136 to couple the electrodes 116 and 118 to the negative output 132 of the second DC power supply 127.

During the third pulse 406 in each pulse cycle 400, the second electrode 118 is biased as a cathode by using the second switch 136 to couple the second electrode 118 to the negative output 132 of the second DC power supply 127 and the first electrode 116 is used an anode by using the first switch 134 to couple the first electrode 116 to the positive output 130 of the first DC power supply 125.

During the fourth pulse 408 in each pulse cycle 400, a negative ion flush bias is applied to the two electrodes 116 and 118 of the plasma source 100 by using the first and second switches 134 and 136 to couple the electrodes 116 and 118 to the negative output 132 of the second DC power supply 127.

In this way, the ion control techniques described here can be used to both increase and to decrease the ion flux toward the substrate 101 that is created using the plasma source 100 by using either a positive flush bias or a negative flush bias, respectively.

The magnitudes of the biases applied during each of the four pulses in each pulse cycle, as well as the duration of each pulse, can be varied to suit the particular application. For example, in one implementation of such an embodiment, the anode and cathode biases that are applied to the electrodes 116 and 118 during the first and third pulses are 150 Volts and −350 Volts, respectively, the positive ion flush bias applied to the electrodes 116 and 118 is 600 Volts, with the duration of the first pulse being 5 microseconds, the duration of the second pulse being 2 microseconds, the duration of the third pulse being 5 microseconds, the duration of the fourth pulse being 2 microseconds, and the duration of the overall pulse cycle being 14 microseconds. It is to be understood, however, that these parameters will be varied based on the particular application.

The ability to vary the magnitude and duration of the ion flush pulses (the second and fourth pulses in each pulse cycle), in addition to varying the magnitudes and durations of the pulses in which the electrodes 116 and 118 are alternated between cathode and anode (the first and second pulses in each pulse cycle), provides an additional degree of control that can be used to more precisely control the plasma source 100. Also, by applying the ion flush biases to the first and second electrodes 116 and 118, in addition to alternating between cathode and anode biasing, ions may be discharged from the plasma source 100 at a sufficient energy level for some high-energy applications.

Although the exemplary embodiment of a plasma source 100 described above in connection with FIGS. 1-4 has a racetrack-shaped cavity 102 and wall 106, it is to be understood that the ion control techniques described here can be used with other types of plasma sources, such as plasma sources that are shaped differently (for example, plasma sources having a cylindrical-shaped cavity).

Also, although the DC power supply 122 is described above in connection with FIGS. 1-4 as being implemented using two DC power supplies 125 and 127, it is to be understood that other numbers of power supplies can be used (for example, one or more than two).

Although the ion control techniques are described above in connection with a single plasma source, it is to be understood that these ion control techniques can be used with multiple plasma sources that are controlled as a single unit (for example, where a different plasma source is used to bias the electrodes during each pulse of each pulse cycle).

A number of embodiments have been described. Nevertheless, it will be understood that various modifications to the described embodiments may be made without departing from the spirit and scope of the claimed invention. Also, combinations of the individual features of the above-described embodiments are considered within the scope of the inventions disclosed here.

EXAMPLE EMBODIMENTS

Example 1 includes Example 1 includes a plasma source comprising: at least first and second electrodes; wherein the plasma source is configured to: during a first portion of each cycle, bias the first electrode as a cathode and use the second electrode as an anode; during a second portion of each cycle, apply an ion flush bias to the first and second electrodes; during a third portion of each cycle, bias the second electrode as a cathode and use the first electrode as an anode; and during a fourth portion of each cycle, apply an ion flush bias to the first and second electrodes.

Example 2 includes the plasma source of Example 1, wherein the plasma source is coupled to one or more direct current power supplies.

Example 3 includes the plasma source of any of the Examples 1-2, wherein the plasma source is coupled to a switching unit.

Example 4 includes the plasma source of any of the Examples claim 1-3, wherein the cavity is formed from a racetrack or cylindrically shaped wall and wherein each of the first and second electrodes follows the wall shape.

Example 5 includes the plasma source of any of the Examples 1-4, further comprising at least one magnet.

Example 6 includes the plasma source of any of the Examples 1-5, wherein each cycle comprises a pulse cycle; wherein the first portion of each cycle comprises a first pulse during which the plasma source is configured to bias the first electrode as a cathode and use the second electrode as an anode; wherein the second portion of each cycle comprises a second pulse during which the plasma source is configured to apply an ion flush bias to the first and second electrodes; wherein the third portion of each cycle comprises a third pulse during which the plasma source is configured to bias the second electrode as a cathode and use the first electrode as an anode; and wherein the fourth portion of each cycle comprises a fourth pulse during which the plasma source is configured to apply an ion flush bias to the first and second electrodes.

Example 7 includes the plasma source of any of the Examples 1-6, wherein the ion flush bias applied to the first and second electrodes during the second and further portions of each cycle comprise a positive ion flush bias that is used to increase the ion flux toward the substrate that is created using the plasma source.

Example 8 includes the plasma source of any of the Examples 1-7, wherein the ion flush bias applied to the first and second electrodes during the second and further portions of each cycle comprise a negative ion flush bias that is used to decrease the ion flux toward the substrate that is created using the plasma source.

Example 9 includes the plasma source of any of the Examples 1-8, wherein at least one inlet is formed in the cavity via which gases enter the cavity.

Example 10 includes the plasma source of any of the Examples 1-9, wherein a discharge aperture is formed in the cavity.

Example 11 includes a method of controlling a plasma source comprising at least first and second electrodes, the method comprising: during a first portion of each cycle, biasing the first electrode as a cathode and using the second electrode as an anode; during a second portion of each cycle, applying an ion flush bias to the first and second electrodes; during a third portion of each cycle, biasing the second electrode as a cathode and using the first electrode as an anode; and during a fourth portion of each cycle, applying an ion flush bias to the first and second electrodes.

Example 12 includes the method of Example 11, wherein each cycle comprises a pulse cycle; wherein the act of, during a first portion of each cycle, biasing the first electrode as a cathode and using the second electrode as an anode comprises during a first pulse of each pulse cycle, biasing the first electrode as a cathode and using the second electrode as an anode; wherein the act of, during a second portion of each cycle, applying an ion flush bias to the first and second electrodes comprises during a second pulse of each pulse cycle, applying an ion flush bias to the first and second electrodes; wherein the act of, during a third portion of each cycle, biasing the first electrode as an anode and using the second electrode as a cathode comprises during a third pulse of each pulse cycle, biasing the first electrode as an anode and using the second electrode as a cathode; and wherein the act of, during a fourth portion of each cycle, applying an ion flush bias to the first and second electrodes comprises during a second pulse of each pulse cycle, applying an ion flush bias to the first and second electrodes.

Example 13 includes the method of any of the Examples 11-12, wherein the ion pulse bias applied to the first and second electrodes during the second and further portions of each cycle comprise a positive ion flush bias that is used to increase the ion flux toward the substrate that is created using the plasma source.

Example 14 includes the method of any of the Examples 11-13, wherein the ion pulse bias applied to the first and second electrodes during the second and further portions of each cycle comprise a negative ion flush bias that is used to decrease the ion flux toward the substrate that is created using the plasma source.

Example 15 includes the method of any of the Examples 11-14, wherein the plasma source is used to in a deposition process.

Example 16 includes the method of any of the Examples 11-15, wherein the plasma source is used to produce a high-energy ion beam.

Example 17 includes a deposition system comprising: a substrate; and a plasma source configured to discharge an ion beam onto the substrate, the plasma source comprising: at least first and second electrodes; wherein the plasma source is configured to: during a first portion of each cycle, bias the first electrode as a cathode and use the second electrode as an anode; during a second portion of each cycle, apply an ion flush bias to the first and second electrodes; during a third portion of each cycle, bias the second electrode as a cathode and use the first electrode as an anode; and during a fourth portion of each cycle, apply an ion flush bias to the first and second electrodes.

Example 18 includes the system of Example 17, further comprising at least one direct current power supply.

Example 19 includes the system of any of the Examples 17-18, wherein the ion pulse bias applied to the first and second electrodes during the second and further portions of each cycle comprise one of: a positive ion flush bias that is used to increase the ion flux toward the substrate that is created using the plasma source; and a negative ion flush bias that is used to decrease the ion flux toward the substrate that is created using the plasma source.

Example 20 includes the system of Example 19, further comprising a switching unit that comprises: a first switch that is configured to selectively couple the first electrode to either a positive output of the direct current power supply or a negative output of the direct current power supply; a second switch that is configured to selectively couple the second electrode to either the positive output of the direct current power supply or the negative output of the direct current power supply.

The invention claimed is:

1. A plasma source comprising:
at least first and second electrodes;
wherein the plasma source is coupled to a controller configured to:
during a first portion of each cycle, bias the first electrode as a cathode and use the second electrode as an anode;
during a second portion of each cycle, apply an ion flush bias to the first and second electrodes;
during a third portion of each cycle, bias the second electrode as a cathode and use the first electrode as an anode; and
during a fourth portion of each cycle, apply an ion flush bias to the first and second electrodes.

2. The plasma source of claim 1, wherein the plasma source is coupled to one or more direct current power supplies.

3. The plasma source of claim 1, wherein the the plasma source is coupled to a switching unit.

4. The plasma source of claim 1, wherein the plasma source includes a racetrack or cylindrically shaped wall defining a cavity, and wherein each of the first and second electrodes follows the wall shape.

5. The plasma source of claim 1, further comprising at least one magnet.

6. The plasma source of claim 1, wherein each cycle comprises a pulse cycle;
wherein the first portion of each cycle comprises a first pulse during which the controller is configured to bias the first electrode as a cathode and use the second electrode as an anode;
wherein the second portion of each cycle comprises a second pulse during which the controller is configured to apply an ion flush bias to the first and second electrodes;
wherein the third portion of each cycle comprises a third pulse during which the controller is configured to bias the second electrode as a cathode and use the first electrode as an anode; and
wherein the fourth portion of each cycle comprises a fourth pulse during which the controller is configured to apply an ion flush bias to the first and second electrodes.

7. The plasma source of claim 1, wherein the ion flush bias applied to the first and second electrodes during the second and further portions of each cycle comprise a positive ion flush bias that is used to increase the ion flux toward the substrate that is created using the plasma source.

8. The plasma source of claim 1, wherein the ion flush bias applied to the first and second electrodes during the second and further portions of each cycle comprise a negative ion flush bias that is used to decrease the ion flux toward the substrate that is created using the plasma source.

9. The plasma source of claim 1, wherein the plasma source defines a cavity having at least one inlet via which gases enter the cavity.

10. The plasma source of claim 9, wherein a discharge aperture is formed in the cavity.

11. A deposition system comprising:
a substrate;
a plasma source configured to discharge an ion beam onto the substrate, the plasma source comprising:
at least first and second electrodes; and
a controller configured to:
during a first portion of each cycle, bias the first electrode as a cathode and use the second electrode as an anode;
during a second portion of each cycle, apply an ion flush bias to the first and second electrodes;
during a third portion of each cycle, bias the second electrode as a cathode and use the first electrode as an anode; and
during a fourth portion of each cycle, apply an ion flush bias to the first and second electrodes.

12. The system of claim 11, further comprising at least one direct current power supply.

13. The system of claim 11, wherein the ion flush bias applied to the first and second electrodes during the second and further portions of each cycle comprise one of:
a positive ion flush bias that is used to increase the ion flux toward the substrate that is created using the plasma source; and
a negative ion flush bias that is used to decrease the ion flux toward the substrate that is created using the plasma source.

14. The system of claim 12, further comprising a switching unit that comprises:
   a first switch that is configured to selectively couple the first electrode to either a positive output of the direct current power supply or a negative output of the direct current power supply;
   a second switch that is configured to selectively couple the second electrode to either the positive output of the direct current power supply or the negative output of the direct current power supply.

\* \* \* \* \*